(12) United States Patent
Jeong

(10) Patent No.: US 7,676,643 B2
(45) Date of Patent: Mar. 9, 2010

(54) DATA INTERFACE DEVICE FOR ACCESSING MEMORY

(75) Inventor: Kyung Ah Jeong, Seoul (KR)

(73) Assignee: C&S Technology Co., Ltd., Seoul (KR)

( * ) Notice: Subject to any disclaimer, the term of this patent is extended or adjusted under 35 U.S.C. 154(b) by 544 days.

(21) Appl. No.: 11/626,446

(22) Filed: Jan. 24, 2007

(65) Prior Publication Data

US 2007/0133339 A1   Jun. 14, 2007

Related U.S. Application Data

(63) Continuation-in-part of application No. 10/969,202, filed on Oct. 20, 2004, now abandoned.

(30) Foreign Application Priority Data

Oct. 20, 2003 (KR) .................. 10-2003-0072893

(51) Int. Cl.
*G06F 12/00* (2006.01)
(52) U.S. Cl. .............. 711/167; 711/105; 365/233.1
(58) Field of Classification Search ............ 711/167, 711/105; 365/233.1
See application file for complete search history.

(56) References Cited

U.S. PATENT DOCUMENTS

| 5,805,872 A | 9/1998 | Bannon | |
|---|---|---|---|
| 6,003,118 A * | 12/1999 | Chen | 711/167 |
| 6,282,210 B1 * | 8/2001 | Rapport et al. | 370/518 |
| 6,437,619 B2 * | 8/2002 | Okuda et al. | 327/158 |
| 6,643,219 B2 | 11/2003 | Van De Graaff | |
| 2003/0179625 A1 * | 9/2003 | Tojima et al. | 365/200 |
| 2004/0151053 A1 * | 8/2004 | Peterson | 365/233 |

FOREIGN PATENT DOCUMENTS

| KR | 2001-0029985 | 4/2001 |
|---|---|---|
| KR | 2003-0009057 | 1/2003 |

* cited by examiner

*Primary Examiner*—Christian P Chace
*Assistant Examiner*—Hashem Farrokh
(74) *Attorney, Agent, or Firm*—Harness, Dickey & Pierce, PLC

(57) ABSTRACT

The data interface device accesses a memory operating in synchronization with a clock. A board clock and selective data capturing improve the operating rate of a memory interface and time-synchronize data flow from memory to memory controller with a internal clock produced by the memory controller; or time-synchronize data flow from the memory controller with the board clock. The internal clock is passed through a sequential path of an output pad of the memory controller, the memory, and an input pad of the memory controller and then re-inputted into the memory controller thereby the feedback clock is generated. The selective data capturing uses a register part for storing data inputted into the memory controller. The register part for storing the data is configured by double registers that are operated in an alternative manner according to a correlation between the inputted data and the feedback clock.

15 Claims, 12 Drawing Sheets

DATA INTERFACE DEVICE FOR ACCESSING MEMORY

CROSS-REFERENCE TO RELATED APPLICATIONS

This application is a Continuation-In-Part Application of and claims the benefit of U.S. application of application Ser. No. 10/969,202 filed on Oct. 20, 2004, and claims the benefit of KR. Application of application Ser. No. 10-2003-0072893 filed on Oct. 20, 2003. The full disclosures of each of these applications are hereby incorporated by reference for all purposes.

BACKGROUND OF THE INVENTION

1. Field of the Invention

The present invention relates to a data interface device for accessing an SDRAM (Synchronous Dynamic Random Access Memory), and more particularly to a data interface device for accessing an SDRAM that can address a phase problem between a clock and data incurable at a high-speed SDRAM access time.

2. Description of the Related Art

FIG. 1 is a schematic diagram illustrating a typical connection state of a data bus and a clock for an SDRAM (Synchronous Dynamic Random Access Memory) interface. A timing diagram associated with FIG. 1 is shown in FIG. 2. Input PADs 3 and 5 and output PADs 4 and 6 are provided between an SDRAM 1 and a memory controller 2. As shown in FIG. 2, it can be seen that a board clock is measured between the PAD 3 of the SDRAM 1 and the PAD 6 of the memory controller 2, and that board DATA is measured between the PAD 4 of the SDRAM 1 and the PAD 5 of the memory controller 2. That is, when an internal clock is outputted from the PAD 6 of the memory controller 2, and then changed to a board level signal, it can be seen that data inputted to the memory controller 2 has larger delay in comparison with the internal clock produced by the memory controller 2. This delay can be different according to various elements such as voltage, temperature, board state, etc. FIG. 3 shows larger delay as compared with FIG. 2. The SDRAM 1 outputs data at a rising edge of the board clock. Here, the board clock is the same as the board level signal based on the internal clock. As shown in FIGS. 2 and 3, as a phase of the board clock for driving the SDRAM 1 is slower than a phase of the internal clock, data outputted from the SDRAM 1 synchronized with the board clock and then inputted to the memory controller 2, has larger delay in comparison with the internal clock.

When delay of a signal such as a clock or data is large, a time point of inputting internal DATA into the memory controller 2 can be the same as a time point of a rising edge of the internal clock as indicated by "V" in FIG. 3. That is, when the internal DATA is used with the internal clock, setup or hold violation can be incurred. To prevent this violation, there is present a method using a negative edge of the internal clock. However, the method has a problem in that data may be inputted at a time point of the negative edge of the internal clock as delay in the method is smaller than delay in FIG. 3.

That is, this phenomenon occurs because a relationship between the internal clock and the data input is asynchronous. When the phenomenon cannot be removed, an operating frequency must be lowered according to an operating state, such that the lowered operating frequency may have a negative effect on the performance of a device.

In many methods for preventing the negative effect, a DLL (Delay Locked Loop) circuit 7 is used as shown in FIG. 4. When the DLL circuit 7 is used, externally inputted data can be predicted to some degree because an external clock (i.e., a board clock) and an internal clock can be matched to each other. Consequently, the above-described asynchronous problem can be avoided. In particular, there are problem in that a design of the DLL circuit 7 requires complicated technology differently from general circuits and it is very difficult for replica delay in PADs, pins, etc. to be predicted.

SUMMARY OF THE INVENTION

Therefore, the present invention has been made in view of the above and other problems, and it is an object of the present invention to provide a data interface device for accessing an SDRAM (Synchronous Dynamic Random Access Memory) that uses a board clock for the SDRAM and a selective data capturing method so that an operating rate of an SDRAM interface can be improved and a point of time that data outputted from the SDRAM is inputted to a SDRAM controller, can be matched with a internal clock produced by the SDRAM controller, or a point of time that data is outputted from the SDRAM controller, can be matched with the board clock.

In accordance with an aspect of the present invention, the above and other objects can be accomplished by the provision of a data interface device for accessing an SDRAM (Synchronous Dynamic Random Access Memory), comprising: a board clock used in the SDRAM; and selective data capturing, wherein the board clock and the selective data capturing are used to improve an operating rate of the memory interface and to match a point of time that data outputted from the memory is inputted to a memory controller with a internal clock produced by the memory controller, or to match a point of time that data is outputted from the memory controller with the board clock, by feeding back the board clock to the memory controller in order to vary a delay time of data input to the memory controller, and checking a relative phase difference between the board clock and the internal clock in order to synchronize data input to the memory controller with the internal clock, thereby accomplishing memory interface without use of an internal DLL circuit. Preferably, the board clock is used to synchronize a point of time that the memory inputs or outputs the data. Preferably, a feedback clock is used for synchronization in the memory controller, and further used for predicting approximately a point of time that data outputted from the memory is inputted to the memory controller when the memory is an external memory, and the internal clock is passed through a sequential path of an output pad of the memory controller, the memory, and an input pad of the memory controller and then re-inputted into the memory controller, thereby the feedback clock is generated.

Preferably, the selective data capturing uses a register part for storing data inputted into the memory controller. Preferably, the register part for storing the data is configured by double registers that are operated in an alternative manner according to a correlation between the inputted data and a feedback clock, and the internal clock is passed through a sequential path of an output pad of the memory controller, the memory, and an input pad of the memory controller and then re-inputted into the memory controller, thereby the feedback clock is generated. Preferably, an inverter is provided in an input stage of one of the registers so that a phase of the feedback clocks inputted into the one of the registers can be different from a phase of the feedback clock inputted into the other one of the registers. Preferably, a cycle of the feedback clock is set to two to four times that of a main clock so that the operation of the memory can be ensured. Preferably, the register part comprises double registers for storing the data respectively, one of the data stored in the double registers is selected using a signal generated by the internal clock.

Preferably, the register part comprises: a first T flip-flop for receiving the internal clock and outputting an internal clock selection signal; a second T flip-flop for receiving a feedback clock in which the board clock delayed through a pad from the internal clock is fed back to the memory controller and outputting a feedback clock selection signal; a first AND element for receiving the feedback clock and an inversion signal of the feedback clock selection signal outputted from the second T flip-flop; a second AND element for receiving the feedback clock and the feedback clock selection signal outputted from the second T flip-flop; a first D flip-flop for receiving a clock outputted from the first AND element and the data outputted from the memory; a second D flip-flop for receiving a clock outputted from the second AND element and the data outputted from the memory; a data selection element for selecting one of the data outputted from the first D flip-flop and the data outputted from the second D flip-flop in response to the internal clock selection signal outputted from the first T flip-flop; and a third D flip-flop for receiving the internal clock and the data outputted from the data selection element and outputting the data in response to the internal clock. Preferably, the data interface device further comprises: an inverter coupled between the first AND element and a contact point coupled to an input terminal of the second AND element and an output terminal of the second T flip-flop, the inverter generating the inversion signal of the feedback clock selection signal. Preferably, the data interface device further comprises: a third AND element for receiving a command signal and the internal clock, carrying out a logic operation and outputting a result of the operation to a reset terminal of the first T flip-flop; and a fourth D flip-flop for receiving the command signal and the internal clock, carrying out a logic operation and outputting a result of the operation to a reset terminal of the second T flip-flop, wherein the third AND element and the fourth D flip-flop are configured to perform reset control of the first and second T flip-flops outputting the internal clock selection signal and the feedback clock selection signal.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 5:
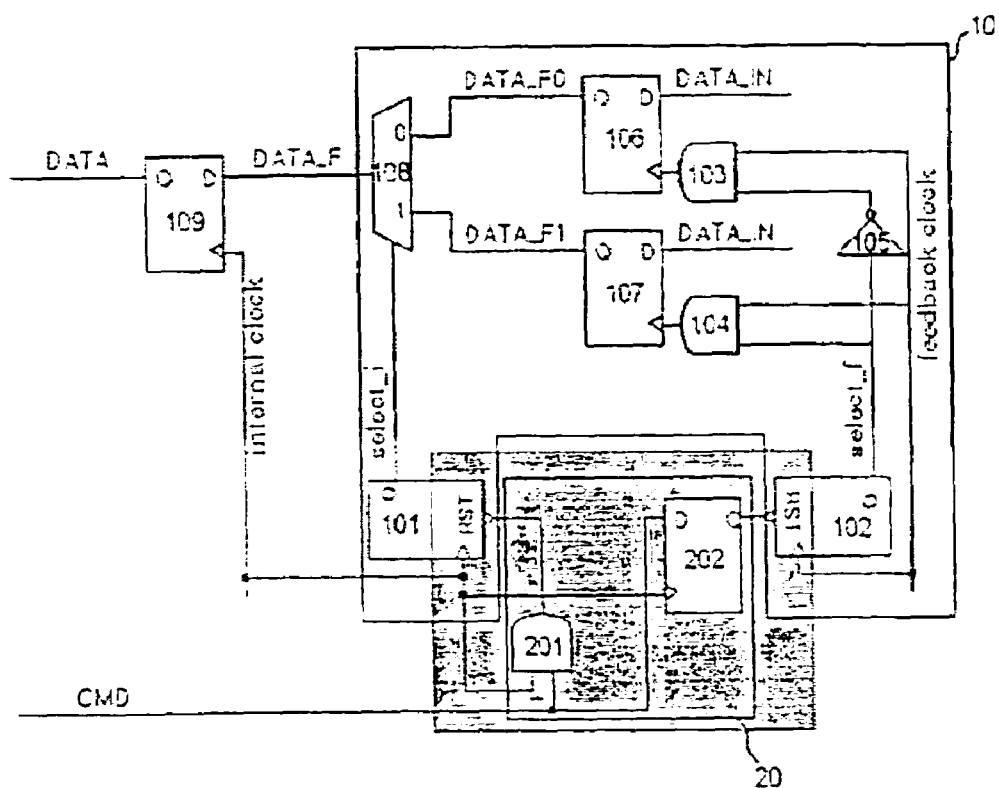
FIG. 5 is a block diagram illustrating a data interface device for accessing an SDRAM.

FIG. 5 shows a circuit for addressing an asynchronous problem between an internal clock and a data input described in "Description of the Related Art". Referring to FIG. 5, a data interface device for accessing an SDRAM (Synchronous Dynamic Random Access Memory) in accordance with the present invention comprises a register part 10 and a reset part 20. The register part 10 uses a board clock fed back as a clock used in the SDRAM. Here, the board clock is the same as a board level signal that the internal clock produced by the memory controller 2 (shown the FIG. 1) is outputted through the PAD 6 and then changed to. Moreover, the register part 10 uses selective data capturing and stores data inputted from the SDRAM to the memory controller. Moreover, the register part 10 uses double registers that are operated in an alternative manner according to a correlation between the inputted data and a feedback clock. The internal clock produced by the memory controller 2 is passed through a sequential path of the output PAD 6, the SDRAM, and an input PAD (not shown) of the memory controller 2, and then re-inputted into the memory controller 2, thereby the feedback clock is generated. This configuration will be described below in detail.

The register part 10 includes a first T flip-flop 101 for receiving a generated internal clock and outputting an internal clock selection signal "select_i"; a second T flip-flop 102 for receiving the feedback clock in which the board clock delayed through a PAD from the internal clock is fed back to the memory controller 2, and outputting a feedback clock selection signal "select_"; a first AND element 103 for simultaneously receiving the feedback clock and an inversion signal of the feedback clock selection signal "select_f" outputted from the second T flip-flop 102; a second AND element 104 for simultaneously receiving the feedback clock and the feedback clock selection signal "select_f" outputted form the second T flip-flop 102; a first D flip-flop 106 for simultaneously receiving a clock outputted from the first AND element 103 and data; a second D flip-flop 107 for simultaneously receiving a clock outputted from the second AND element 104 and data; a data selection element 108 for selecting one of data outputted from the first D flip-flop 106 and data outputted from the second D flip-flop 107 in response to the internal clock selection signal "select_i" outputted from the first T flip-flop 101; and a third D flip-flop 109 for simultaneously receiving the internal clock and the data outputted from the data selection element 108 and outputting the data in response to the internal clock. Here, the register part 10 further comprises an inverter 105 between the first AND element 103 and a contact point coupled to the second AND element 104 and the second T flip-flop 102.

The reset part 20 comprises a third AND element 201 for simultaneously receiving a command signal CMD and the internal clock, carrying out a logic operation and outputting a result of the operation to a reset terminal of the first T flip-flop 101; and a fourth D flip-flop 202 for simultaneously receiving the command signal CMD and the internal clock, carrying out a logic operation and outputting a result of the operation to a reset terminal of the second T flip-flop 102.

Figure 1:
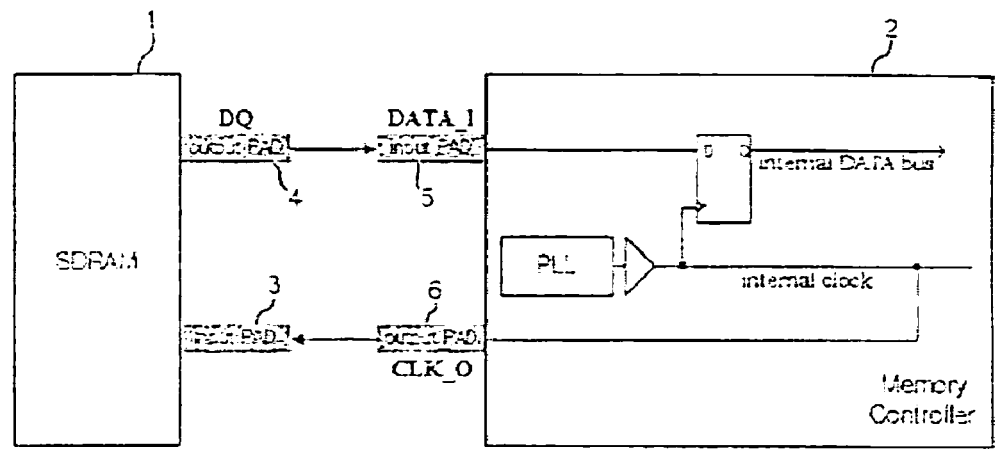
FIG. 1 is a schematic diagram illustrating a typical connection state of a data bus and a clock for an SDRAM (Synchronous Dynamic Random Access Memory) interface.
Figure 2:
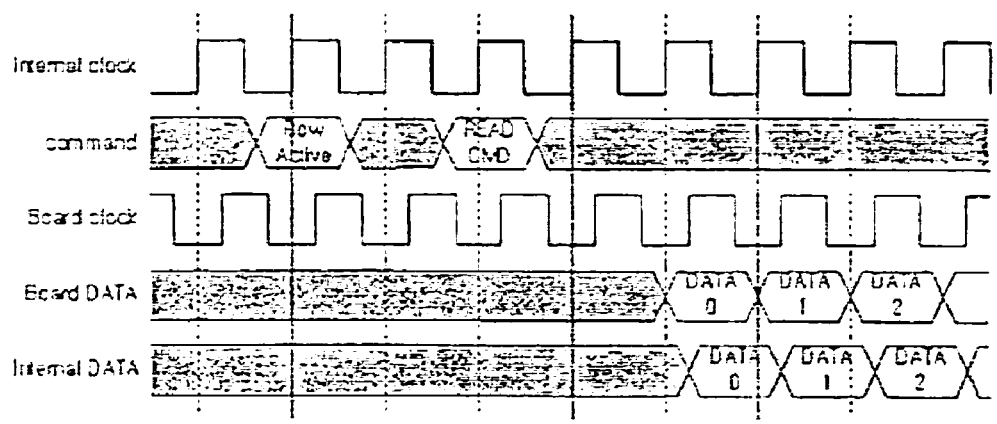
FIG. 2 is a timing diagram illustrating data delay due to board clock delay.
Figure 3:
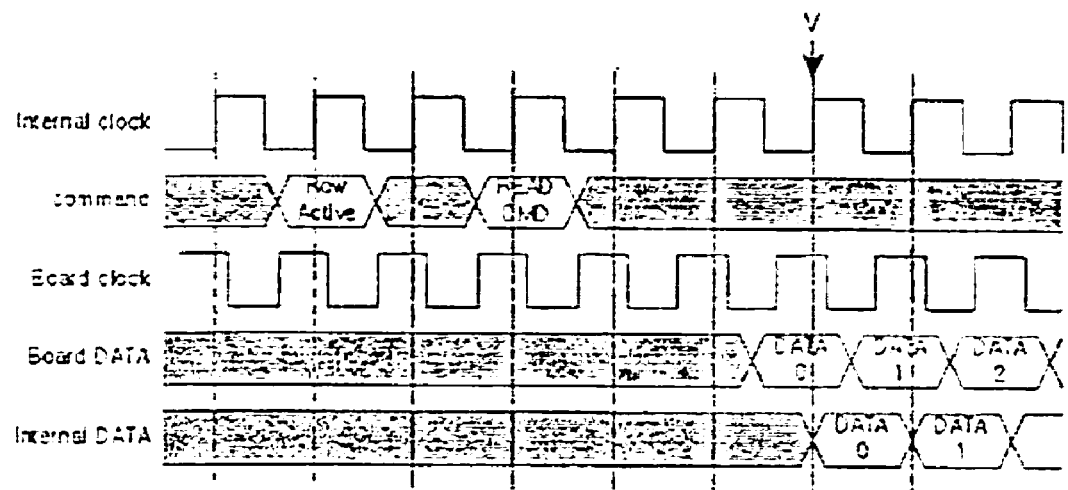
FIG. 3 is a timing diagram illustrating a case where setup or hold violation is caused by increased delay.
Figure 4:
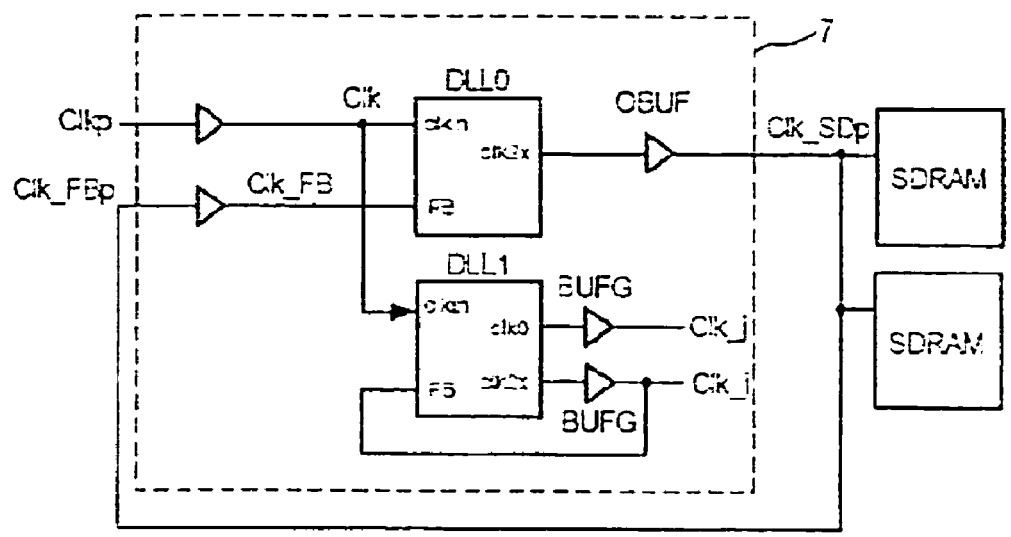
FIG. 4 is a circuit diagram illustrating a control circuit for matching phases of an internal clock and a board clock using a DLL (Delay Locked Loop)

As described above, the feedback clock in FIG. 5 is the board clock used for operating the SDRAM in FIG. 1 re-inputted into the memory controller. Moreover, a signal corresponding to internal DATA in FIG. 1 is DATA_IN in FIG. 5. DATA_IN is stored in response to the internal clock as DATA in FIG. 5.

Assuming that a difference between delay of an input path of external DATA and delay of an input path of a clock is small, a problem in storing DATA_IN is not incurred when the feedback clock is used. However, when DATA is stored, a phase relationship between the feedback clock and the internal clock may be a problem. This problem can be addressed using the circuit structure of FIG. 5.

Figure 6:
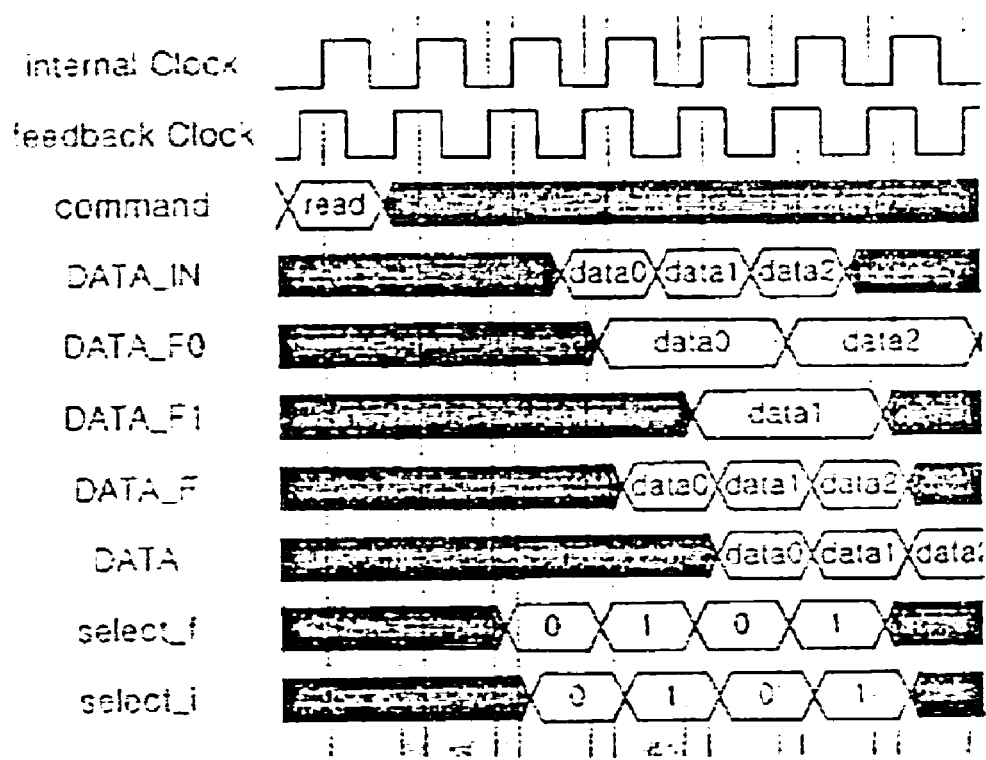
FIG. 6 shows a timing diagram associated with the data interface device for accessing the SDRAM.

There is a problem in that DATA associated with the internal clock may not be stabilized when DATA captured by the feedback clock is used in the internal clock. Thus, DATA is used in the next internal clock after being captured by the feedback clock in accordance with the present invention. For this, DATA must be stored once during two clocks. Double registers can be alternately used. A signal for selecting a register must be generated according to the feedback clock so that no asynchronous problem is incurred. This is shown in FIG. 6. As shown in FIG. 6, DATA_F0 and DATA_F1 are stored in the register part 10 once during two clocks in response to the feedback clock selection signal "select_f", respectively. DATA_F outputted from the data selection element 108 is inputted into the third D flip-flop 109 in response to the internal clock selection signal "select_i". Consequently, DATA is outputted in response to the internal clock selection signal "select_i".

Figure 7A:
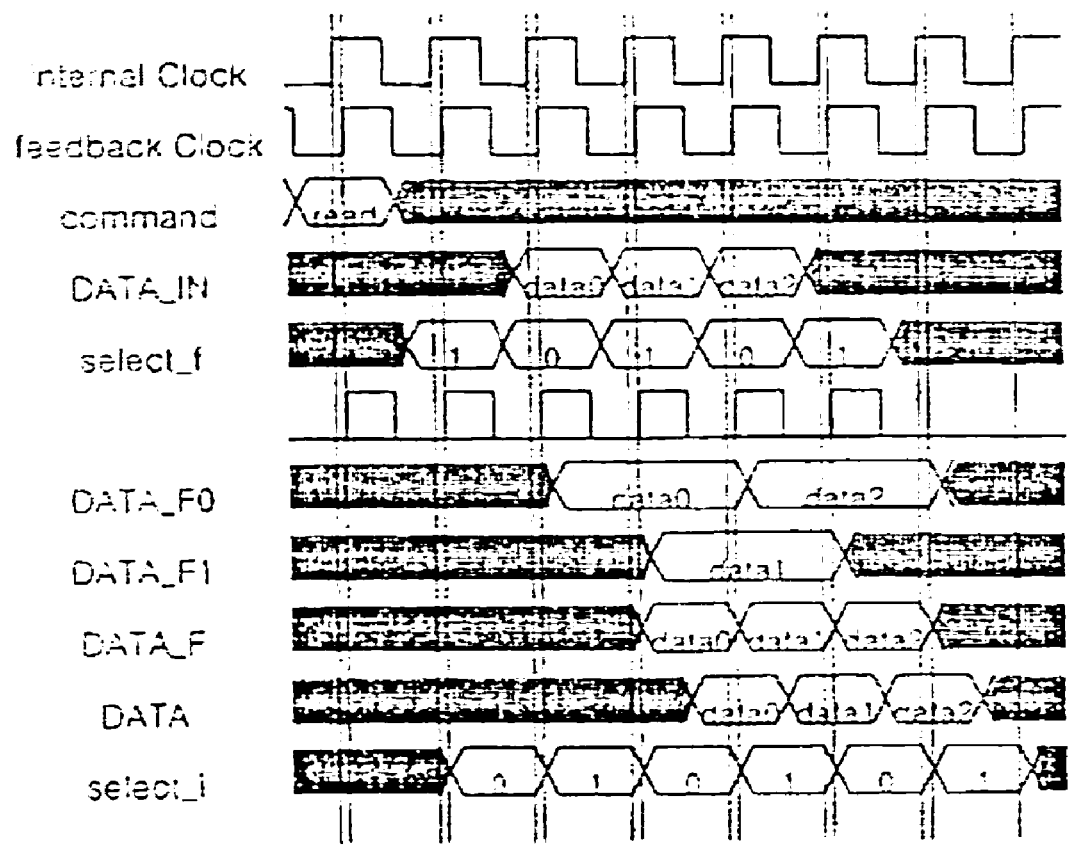
FIGS. 7A to 7D are timing diagrams illustrating the motion of data according to a phase difference between an internal clock and a feedback clock.
Figure 7B:
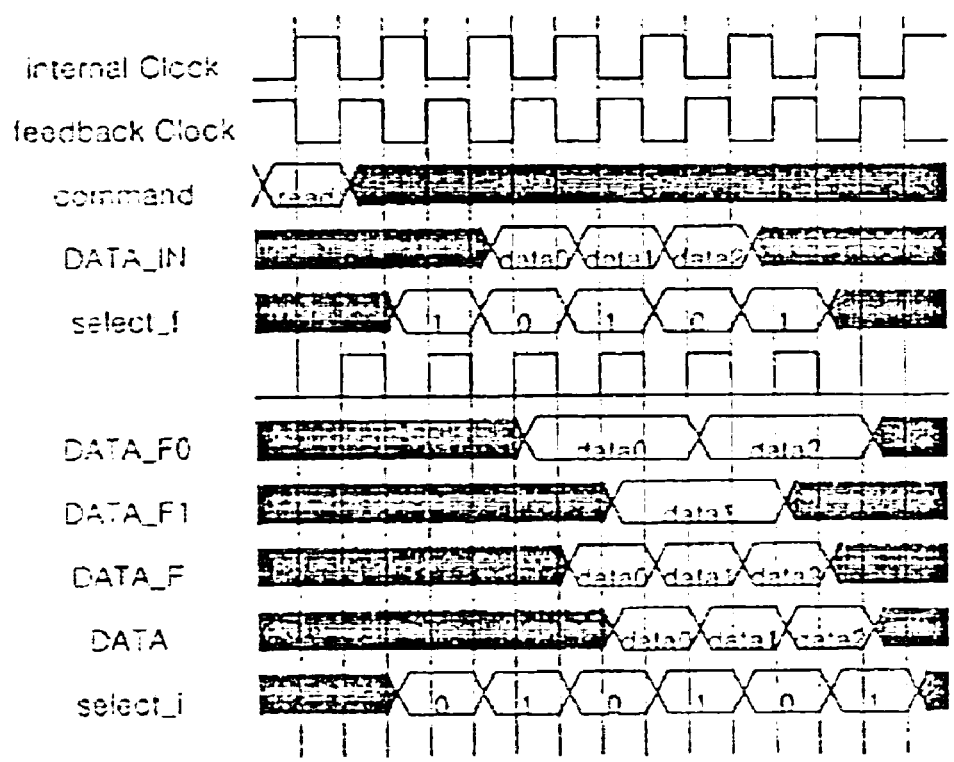
Figure 7C:
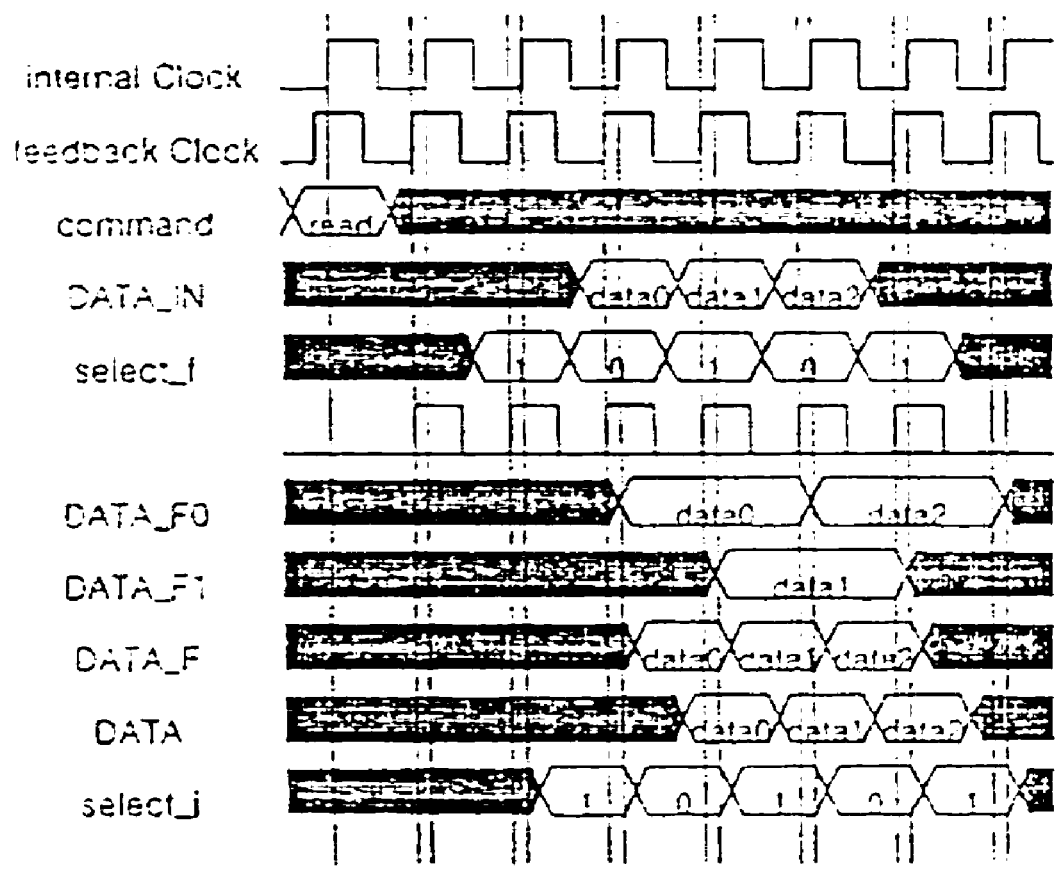
Figure 7D:
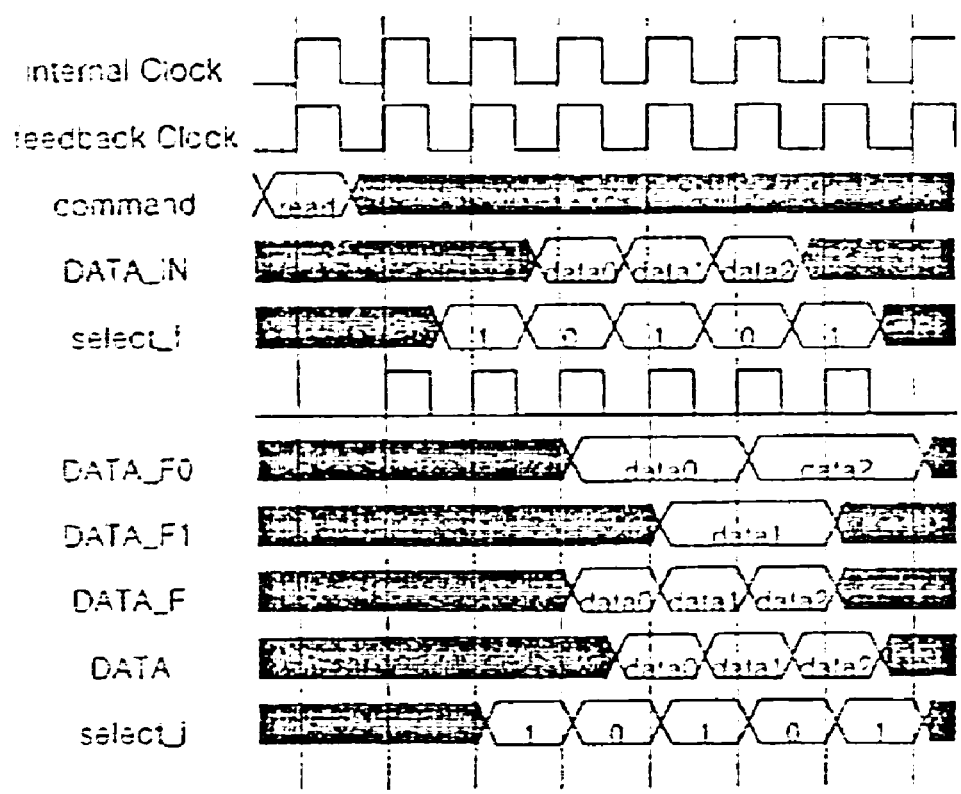
Figure 8A:
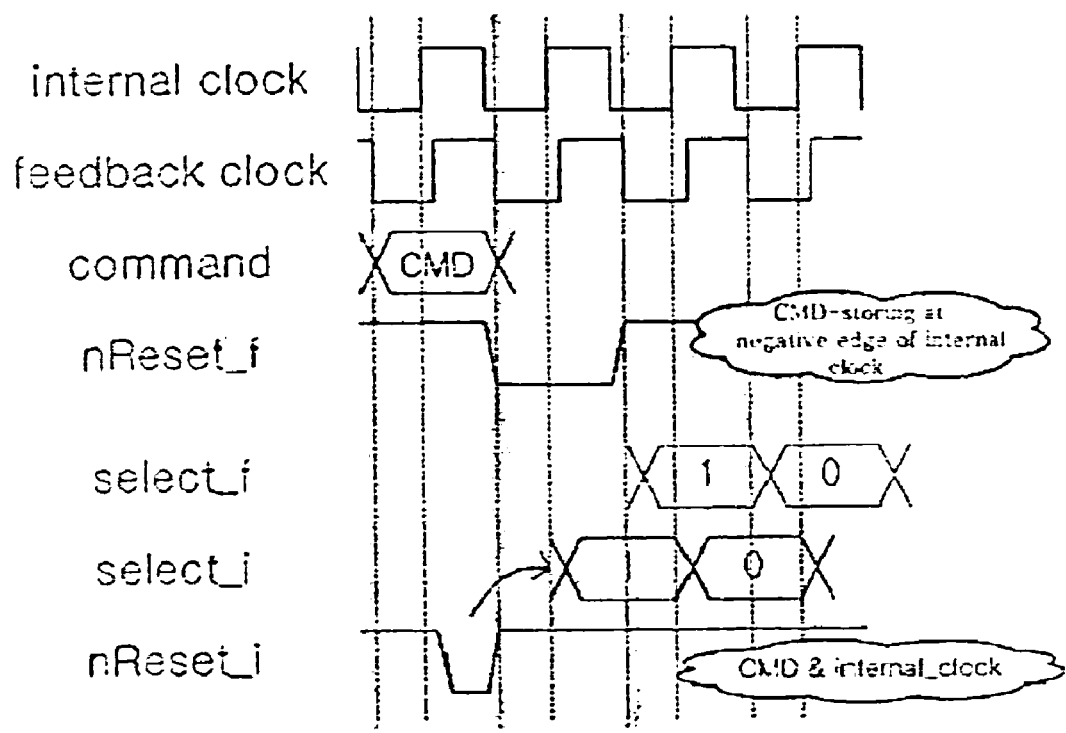
FIGS. 8A to 8D are timing diagrams illustrating reset signals and signals select_i and select_f according to feedback clock delay.
Figure 8B:
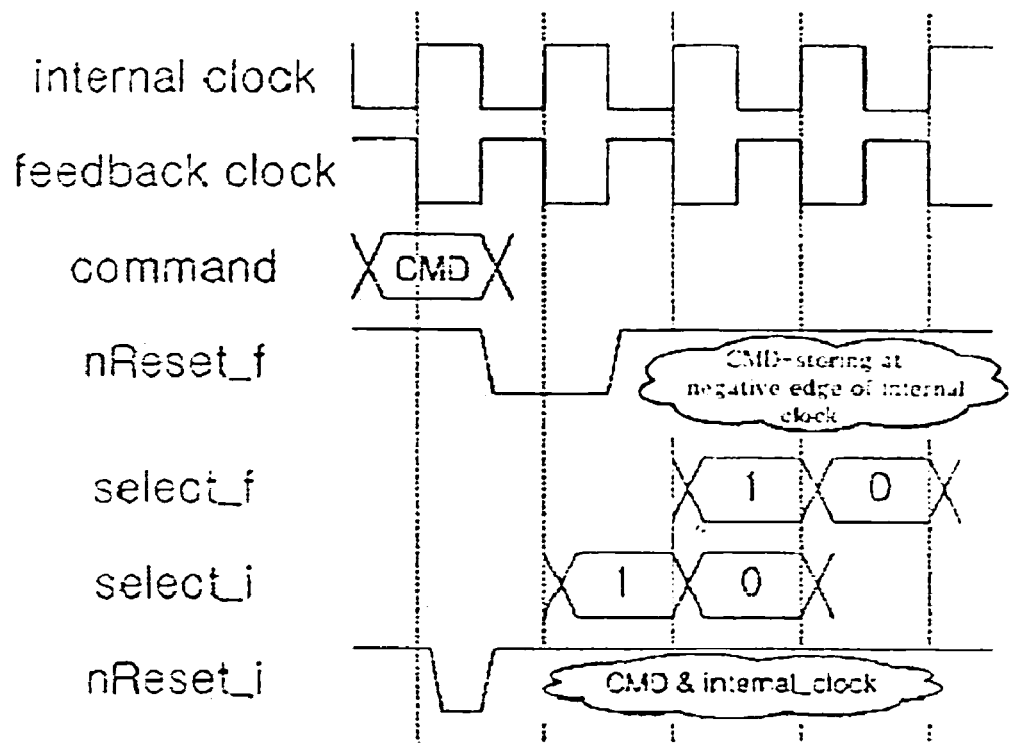
Figure 8C:
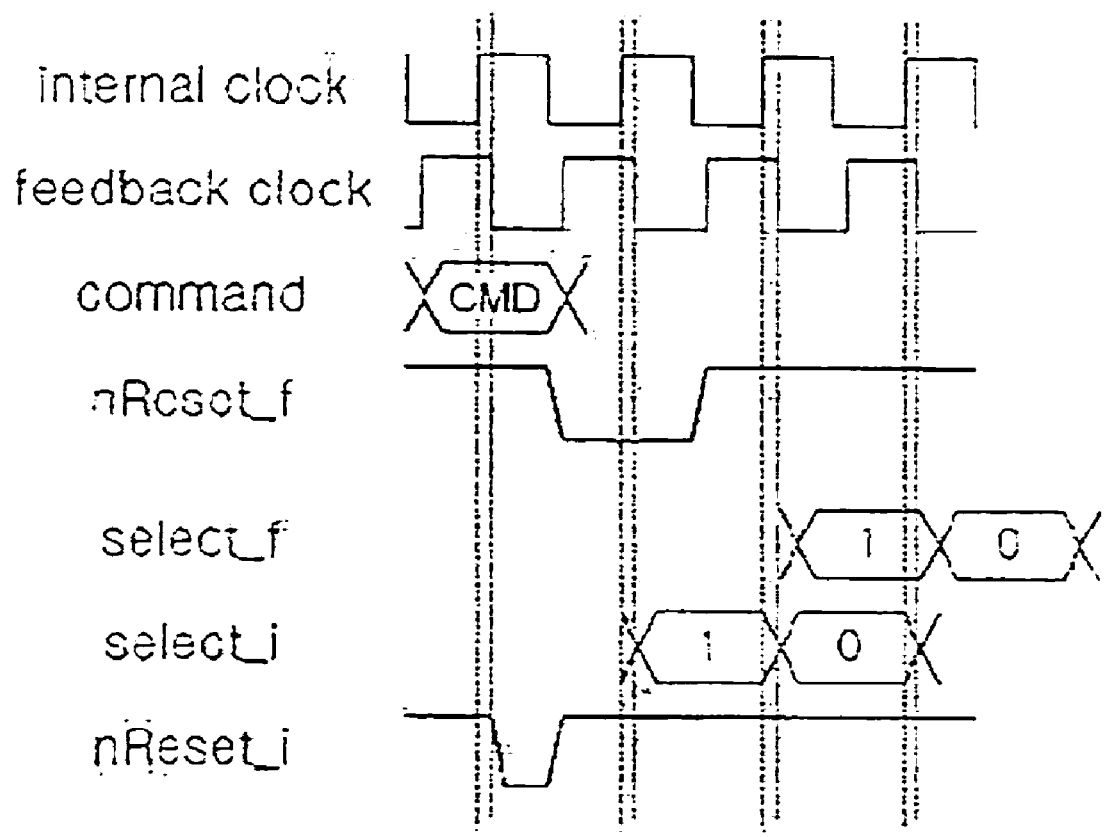
Figure 8D:
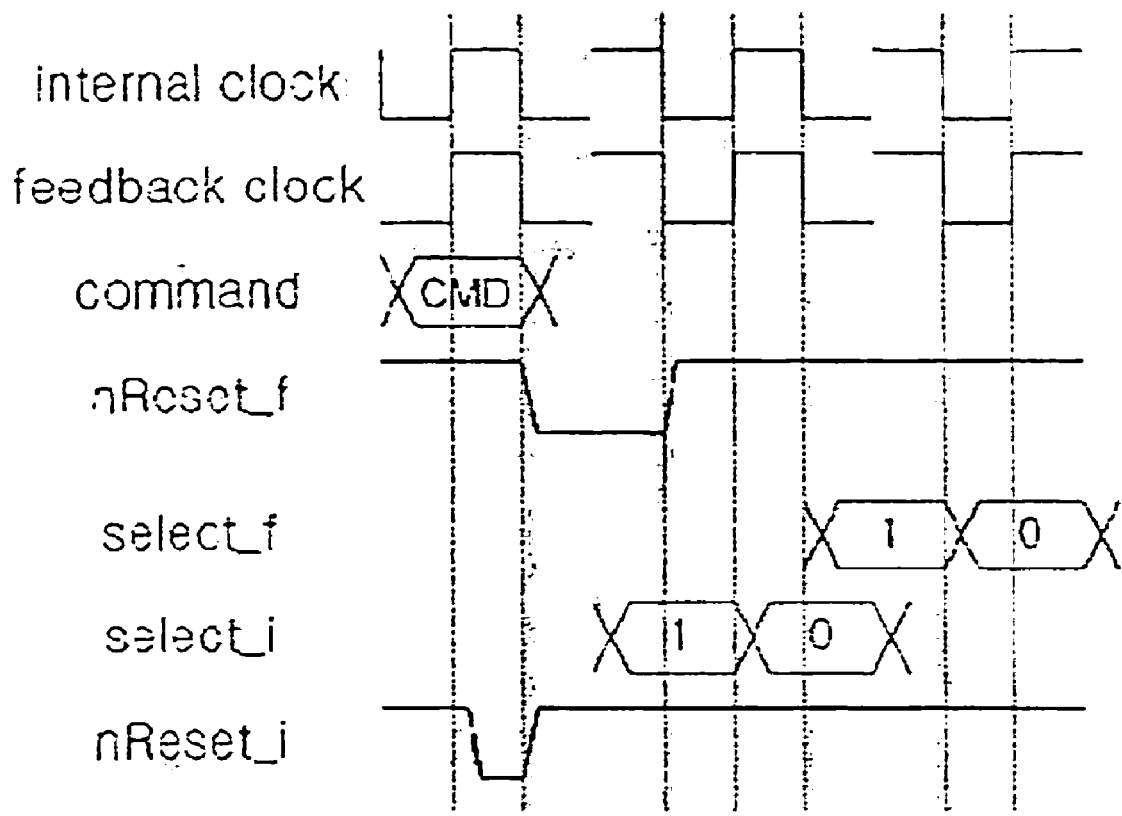

FIGS. 7A to 7D are timing diagrams illustrating the motion of data according to a phase difference between an internal clock and a feedback clock. FIG. 7A shows the case where a phase difference between the internal clock and the feedback clock is smaller than half a clock. FIG. 7B shows the case where a phase difference between the internal clock and the feedback clock is accurately half a clock cycle. FIGS. 7C and 7D show a data interface when a delay value is relatively large. In particular, FIG. 7D shows the case where a phase difference between the internal clock and the feedback clock is one clock.

It can be seen that DATA stored according to a feedback operation in relation to various types of delay shown in FIGS. 7A to 7D does not cause violation due to the internal clock when using the structure shown in FIG. 5.

However, when the feedback clock selection signal "select_f" is generated based on the feedback clock, no problem occurs in a clock control process. The internal clock selection signal "select_i" for deciding internal data between two data units DATA_F0 and DATA_F1 must be generated by the internal clock. In this case, because motion between the signals "select_i" and "select_f" plays an important role as shown in FIGS. 7A to 7D, reset signals to be inputted into two flip-flops 101 and 102 must be appropriately generated. Because the motion between the signals "select_i" and "select_f" can be different according to a phase difference between two clocks, there is a problem in that a reset signal cannot be generated based on each clock.

To address this problem, a circuit such as the reset part 20 shown in FIG. 5 can be implemented. Here, a reset signal is generated according to a command signal. A command that is inherently generated at a rising edge of the internal clock and is stored at a falling edge of the internal clock is referred to as "CMD".

That is, a reset input of a flip-flop 101 for generating the signal "select_i" is generated by ANDing the CMD and a high-level internal clock. A reset input of a flip-flop 102 for generating the signal "select_f" uses the CMD stored at a negative edge of the internal clock. FIGS. 8A to 8D show reset signals and motion between the signals "select_i" and "select_f" according to feedback delay shown in FIGS. 7A to 7D.

As apparent from the above description, the input rate of DATA associated with a used clock decreases as an existing memory access rate increases, such that violation may occur when DATA is stored. Because a DATA input time and an internal clock are not influenced by each other in a data interface device for accessing an SDRAM (Synchronous Dynamic Random Access Memory) in accordance with the present invention, an operating frequency can be increased without a complex circuit such as a DLL (Delay Locked Loop) circuit that cannot easily be designed.

In the preferred embodiments of the present invention, a case where a device that is accessed by a data interface device according to the present invention, is an SDRAM (Synchronous Dynamic Random Access Memory) has been described. However, besides the SDRAM, any other memory may be used as the device that is accessed by the data interface device, as long as the memory operates in synchronization with a clock.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The entire content of Priority Document No. 10-2003-72893 is incorporated herein by reference.

What is claimed is:

1. A data interface device for accessing a memory, comprising:
    a board clock used in the memory; and
    selective data capturing,
    wherein the board clock and the selective data capturing are used to improve an operating rate of the memory interface and to match a point of time that data outputted from the memory is inputted to a memory controller with a internal clock produced by the memory controller, or to match a point of time that data is outputted from the memory controller with the board clock, by feeding back the board clock to the memory controller in order to vary a delay time of data input to the memory controller, and checking a relative phase difference between the board clock and the internal clock in order to synchronize data input to the memory controller with the internal clock, thereby accomplishing memory interface without use of an internal DLL circuit;
    wherein the selective data capturing uses a register part for storing data inputted into the memory controller;
    wherein the register part for storing the data is configured by double registers that are operated in an alternative manner according to a correlation between the inputted data and a feedback clock, and the internal clock is passed through a sequential path of an output pad of the memory controller, the memory, and an input pad of the memory controller and then re-inputted into the memory controller, thereby the feedback clock is generated.

2. The data interface device of claim 1, wherein an inverter is provided in an input stage of one of the registers so that a phase of the feedback clocks inputted into the one of the registers can be different from a phase of the feedback clock inputted into the other one of the registers.

3. The data interface device of claim 2, wherein the register part comprises:
    a first T flip-flop for receiving the internal clock and outputting an internal clock selection signal;

a second T flip-flop for receiving the feedback clock in which the board clock delayed through a pad from the internal clock is fed back and outputting a feedback clock selection signal;

a first AND element for receiving the feedback clock and an inversion signal of the feedback clock selection signal outputted from the second T flip-flop;

a second AND element for receiving the feedback clock and the feedback clock selection signal outputted from the second T flip-flop;

a first D flip-flop for receiving a clock outputted from the first AND element and the data outputted from the memory;

a second D flip-flop for receiving a clock outputted from the second AND element and the data outputted from the memory;

a data selection element for selecting one of the data outputted from the first D flip-flop and the data outputted from the second D flip-flop in response to the internal clock selection signal outputted from the first T flip-flop; and a third D flip-flop for receiving the internal clock and the data outputted from the data selection element and outputting the data in response to the internal clock.

4. The data interface device of claim 3, further comprising:

a third AND element for receiving a command signal and the internal clock, carrying out a logic operation and outputting a result of the operation to a reset terminal of the first T flip-flop; and a fourth D flip-flop for receiving the command signal and the internal clock, carrying out a logic operation and outputting a result of the operation to a reset terminal of the second T flip-flop, wherein the third AND element and the fourth D flip-flop are configured to perform reset control of the first and second T flip-flops outputting the internal clock selection signal and the feedback clock selection signal.

5. The data interface device of claim 3, further comprising:

an inverter coupled between the first AND element and a contact point coupled to an input terminal of the second AND element and an output terminal of the second T flip-flop, the inverter generating the inversion signal of the feedback clock selection signal.

6. The data interface device of claim 1, wherein a cycle of the feedback clock is set to two to four times that of a main clock so that the operation of the memory can be ensured.

7. The data interface device of claim 6, wherein the register part comprises:

a first T flip-flop for receiving the internal clock and outputting an internal clock selection signal;

a second T flip-flop for receiving the feedback clock in which the board clock delayed through a pad from the internal clock is fed back and outputting a feedback clock selection signal;

a first AND element for receiving the feedback clock and an inversion signal of the feedback clock selection signal outputted from the second T flip-flop;

a second AND element for receiving the feedback clock and the feedback clock selection signal outputted from the second T flip-flop;

a first D flip-flop for receiving a clock outputted from the first AND element and the data outputted from the memory;

a second D flip-flop for receiving a clock outputted from the second AND element and the data outputted from the memory;

a data selection element for selecting one of the data outputted from the first D flip-flop and the data outputted from the second D flip-flop in response to the internal clock selection signal outputted from the first T flip-flop; and a third D flip-flop for receiving the internal clock and the data outputted from the data selection element and outputting the data in response to the internal clock.

8. The data interface device of claim 7, further comprising:

an inverter coupled between the first AND element and a contact point coupled to an input terminal of the second AND element and an output terminal of the second T flip-flop, the inverter generating the inversion signal of the feedback clock selection signal.

9. The data interface device of claim 7, further comprising:

a third AND element for receiving a command signal and the internal clock, carrying out a logic operation and outputting a result of the operation to a reset terminal of the first T flip-flop; and a fourth D flip-flop for receiving the command signal and the internal clock, carrying out a logic operation and outputting a result of the operation to a reset terminal of the second T flip-flop, wherein the third AND element and the fourth D flip-flop are configured to perform reset control of the first and second T flip-flops outputting the internal clock selection signal and the feedback clock selection signal.

10. The data interface device of claim 1, wherein the register part comprises:

a first T flip-flop for receiving the internal clock and outputting an internal clock selection signal;

a second T flip-flop for receiving the feedback clock in which the board clock delayed through a pad from the internal clock is fed back and outputting a feedback clock selection signal;

a first AND element for receiving the feedback clock and an inversion signal of the feedback clock selection signal outputted from the second T flip-flop;

a second AND element for receiving the feedback clock and the feedback clock selection signal outputted from the second T flip-flop;

a first D flip-flop for receiving a clock outputted from the first AND element and the data outputted from the memory;

a second D flip-flop for receiving a clock outputted from the second AND element and the data outputted from the memory;

a data selection element for selecting one of the data outputted from the first D flip-flop and the data outputted from the second D flip-flop in response to the internal clock selection signal outputted from the first T flip-flop; and a third D flip-flop for receiving the internal clock and the data outputted from the data selection element and outputting the data in response to the internal clock.

11. The data interface device of claim 10, further comprising:

an inverter coupled between the first AND element and a contact point coupled to an input terminal of the second AND element and an output terminal of the second T flip-flop, the inverter generating the inversion signal of the feedback clock selection signal.

12. The data interface device of claim 10, further comprising:

a third AND element for receiving a command signal and the internal clock, carrying out a logic operation and outputting a result of the operation to a reset terminal of the first T flip-flop; and a fourth D flip-flop for receiving the command signal and the internal clock, carrying out a logic operation and outputting a result of the operation to a reset terminal of the second T flip-flop, wherein the third AND element and the fourth D flip-flop are configured to perform reset control of the first and second T flip-flops outputting the internal clock selection signal and the feedback clock selection signal.

13. The data interface device of claim 1, wherein the register part comprises:

a first T flip-flop for receiving the internal clock and outputting an internal clock selection signal;

a second T flip-flop for receiving a feedback clock in which the board clock delayed through a pad from the internal clock is fed back to the memory controller and outputting a feedback clock selection signal;

a first AND element for receiving the feedback clock and an inversion signal of the feedback clock selection signal outputted from the second T flip-flop;

a second AND element for receiving the feedback clock and the feedback clock selection signal outputted from the second T flip-flop;

a first D flip-flop for receiving a clock outputted from the first AND element and the data outputted from the memory;

a second D flip-flop for receiving a clock outputted from the second AND element and the data outputted from the memory;

a data selection element for selecting one of the data outputted from the first D flip-flop and the data outputted from the second D flip-flop in response to the internal clock selection signal outputted from the first T flip-flop; and a third D flip-flop for receiving the internal clock and the data outputted from the data selection element and outputting the data in response to the internal clock.

14. The data interface device of claim 13, further comprising:

an inverter coupled between the first AND element and a contact point coupled to an input terminal of the second AND element and an output terminal of the second T flip-flop, the inverter generating the inversion signal of the feedback clock selection signal.

15. The data interface device of claim 13, further comprising:

a third AND element for receiving a command signal and the internal clock, carrying out a logic operation and outputting a result of the operation to a reset terminal of the first T flip-flop; and a fourth D flip-flop for receiving the command signal and the internal clock, carrying out a logic operation and outputting a result of the operation to a reset terminal of the second T flip-flop, wherein the third AND element and the fourth D flip-flop are configured to perform reset control of the first and second T flip-flops outputting the internal clock selection signal and the feedback clock selection signal.

\* \* \* \* \*